(12) United States Patent
Kang et al.

(10) Patent No.: US 7,477,563 B2
(45) Date of Patent: Jan. 13, 2009

(54) DYNAMIC RANDOM ACCESS MEMORY DEVICE AND ASSOCIATED REFRESH CYCLE

(75) Inventors: Uk-song Kang, Yongin-si (KR); Kee-won Kwon, Seongnam-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 12 days.

(21) Appl. No.: 11/604,708

(22) Filed: Nov. 28, 2006

(65) Prior Publication Data

US 2007/0133315 A1 Jun. 14, 2007

(30) Foreign Application Priority Data

Nov. 29, 2005 (KR) .................. 10-2005-0115006

(51) Int. Cl.
*G11C 7/00* (2006.01)

(52) U.S. Cl. ............ 365/222; 365/185.09; 365/200

(58) Field of Classification Search ............ 365/222, 365/185.09, 200, 230.08, 189.05; 714/763–766
See application file for complete search history.

(56) References Cited

U.S. PATENT DOCUMENTS 6,697,992 B2 * 2/2004 Ito et al. .................. 714/763
6,795,362 B2 * 9/2004 Nakai et al. .............. 365/222

FOREIGN PATENT DOCUMENTS

| JP | 2002-025299 | 1/2002 |
| JP | 2002-056671 | 2/2002 |
| JP | 2003-132677 | 5/2003 |
| KR | 10-2005-0078242 | 8/2005 |

* cited by examiner

*Primary Examiner*—David Lam
(74) *Attorney, Agent, or Firm*—Volentine & Whitt, PLLC

(57) ABSTRACT

A dynamic random access memory device having reduced power consumption and a refresh cycle method. The memory device includes a monitoring address storage unit storing multiple monitoring addresses, an error correction code (ECC) engine detecting whether or not an error occurs in monitoring bits corresponding to the monitoring addresses, and a refresh cycle determining circuit adjusting a self refresh cycle depending on whether or not an error occurs in the monitoring bits.

20 Claims, 6 Drawing Sheets

DYNAMIC RANDOM ACCESS MEMORY DEVICE AND ASSOCIATED REFRESH CYCLE

BACKGROUND OF THE INVENTION

1. Field of the Invention

The present invention relates to a dynamic random access memory device, and more particularly, to a dynamic random access memory device having reduced power consumption and a method of determining a refresh cycle thereof.

This application claims priority from Korean Patent Application No. 10-2005-0115006 filed on Nov. 29, 2005, in the Korean Intellectual Property Office, the disclosure of which is incorporated herein by reference in its entirety.

2. Discussion of Related Art

Dynamic random access memory devices include a plurality of memory cells, each of which has a transistor that serves as a switch and a capacitor that stores data. However, initial data stored in the capacitor may be lost due to leakage current generated in a PN junction of a MOS transistor. Accordingly, in dynamic random access memory devices, a refresh operation is required to recharge data in the memory cell before data is lost. The refresh operation includes an automatic refresh operation, a self refresh operation, and so on. In the self refresh operation, refresh is performed while the dynamic random access memory device sequentially changes an internal address in response to a refresh instruction signal.

The self refresh operation is repeated according to an internally defined cycle. The recharge cycle is referred to as a refresh cycle tREF. The refresh cycle is determined based on the data retention characteristics, which are not constant due to changes in process, voltage, and temperature (PVT). However, during this refresh operation, the dynamic random access memory device consumes high standby power as compared to a static RAM (SRAM) or flash memory device. Accordingly, there is a need for a refresh cycle associated with a dynamic random access memory device which requires reduced power consumption.

SUMMARY OF THE INVENTION

Exemplary embodiments of the present invention are directed to a dynamic random access memory device that includes a monitoring address storage unit storing multiple monitoring addresses, an error correction code (ECC) engine detecting whether or not an error occurs in the monitoring bits corresponding to the monitoring addresses, and a refresh cycle determining circuit adjusting a self refresh cycle depending on whether or not an error occurs in the monitoring bits.

DESCRIPTION OF EMBODIMENTS

Figure 1:
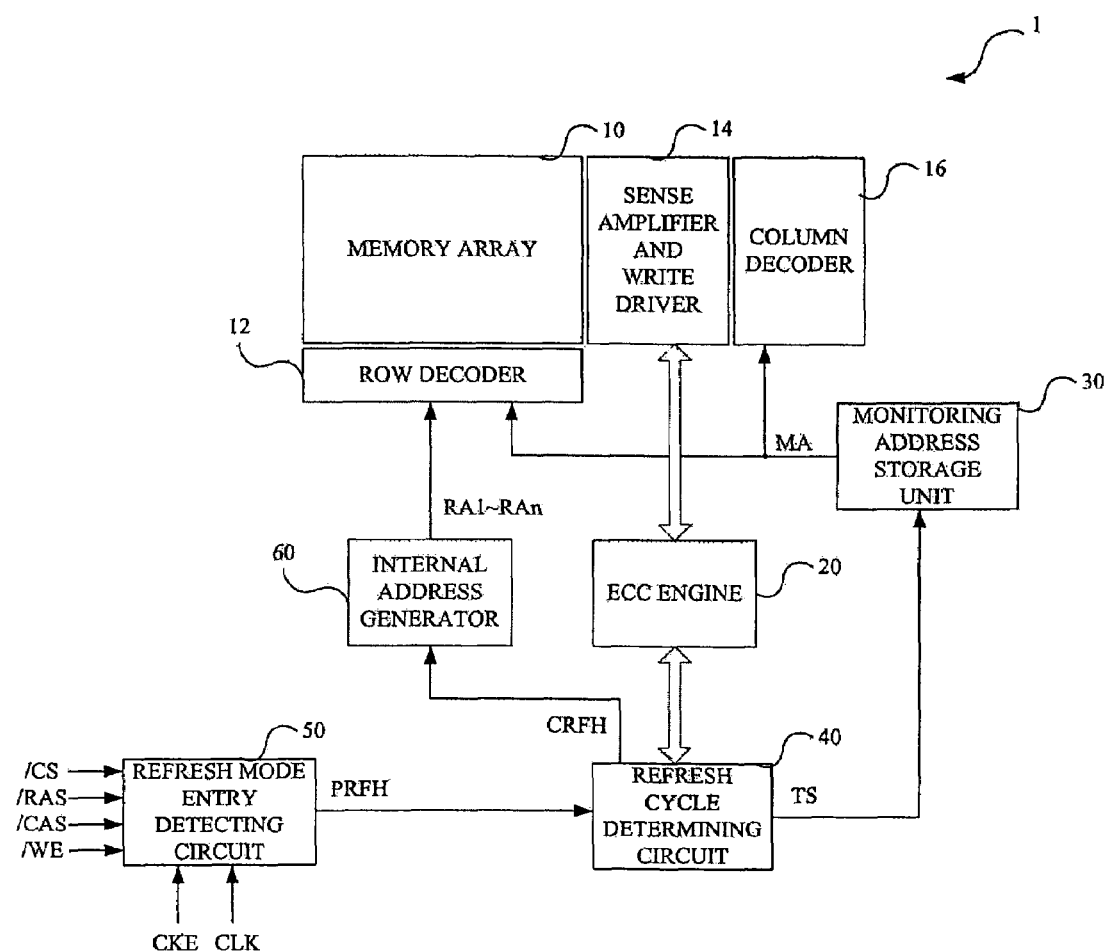
FIG. 1 is a block diagram illustrating a dynamic random access memory device according to an embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 is a block diagram illustrating a dynamic random access memory device according to an embodiment of the present invention. Dynamic random access memory device 1 includes a memory array 10, an ECC engine (Error Correction Code engine) 20, a monitoring address storage unit 30, and a refresh cycle determining circuit 40. Memory array 10 includes a plurality of memory cells arranged in a two-dimensional manner (e.g. matrix configuration). In the memory array 10 shown in FIG. 1, one memory bank is illustrated, but multiple memory banks may be utilized. The memory cells of memory array 10 arranged in a row are electrically connected to word lines, and the memory cells arranged in a column are electrically connected to bit lines (or complementary bit lines).

Row decoder 12 selects a word line of memory array 10 according to the decoding result of a row address signal. During a read operation, sense amplifier and write driver 14 amplifies a potential difference of a pair of data lines individually connected to a pair of bit lines to read data stored in a memory cell. During a write operation, the sense amplifier and write driver 14 transmits predetermined data through the pair of data lines and the pair of bit lines to store data in the memory cell. A column decoder 16 communicates with memory array 10 to select a memory cell, from and into which data is to be read and written according to the decoding result of a column address signal.

When a refresh operation is not performed on a memory array for a predetermined time, data stored in a memory cell capacitor of the memory array may be lost. This refresh operation requires power consumption. However, in order to reduce standby power consumption, a self refresh cycle tREF needs to be performed using an error detection and correction scheme without damaging data stored in the memory cell capacitor. Additional information associated with the stored data is required to detect and correct this data error. In particular, multiple data bits and an ECC (Error Correction Code) bit are stored in memory array 10. The ECC bit may be generated using various types of encoding systems, such as hamming codes, Huffman codes, parity codes, turbo codes, cyclic codes, low-density parity-check codes, Reed-Muller codes, Reed-Solomon error correction codes, or the like. ECC engine 20 generates an ECC bit corresponding to the data bits using the data bits stored in the memory array 10 before the memory array performs a self refresh operation and stores the ECC bit in a predetermined region of the memory array 10. One ECC bit can be added and stored in memory array 10 for every 8-bit data bits. This ECC data bit is used during the self refresh operation to determine the presence of a data error and to correct any error in the data bits and/or at the end of the self refresh operation. Additionally, errors are detected in some, but not all of the data bits. This detection method reduces power consumption as compared with operations that detect errors in all of the data bits. The selected data bits and the ECC bit stored in memory array 10 are hereinafter referred to as "monitoring bits."

Figure 6:
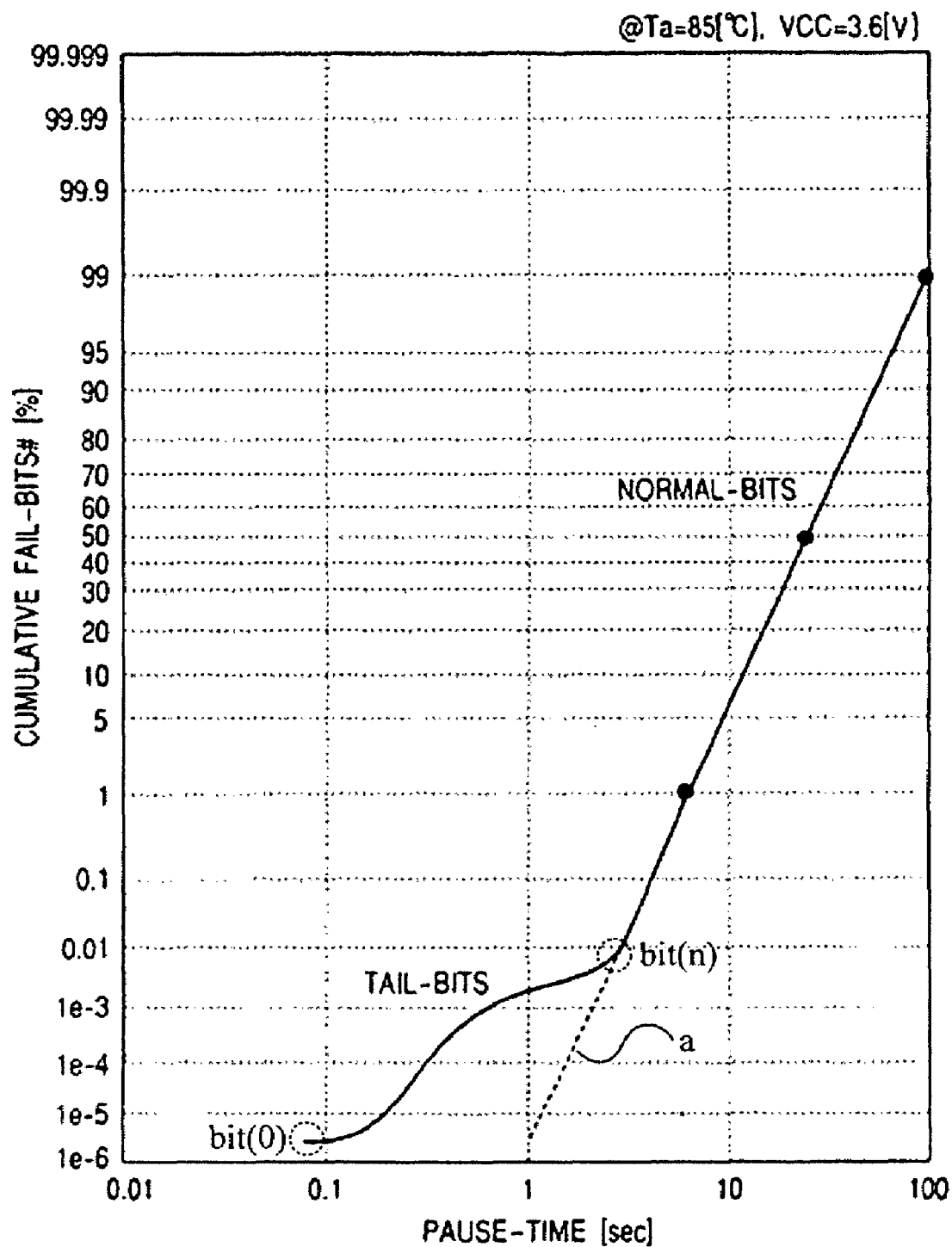
FIG. 6 is a pause refresh characteristic diagram showing the normalized number of accumulated error bits relative to a pause time.

The monitoring bits are selected in advance through testing and the addresses of the selected monitoring bits are stored in monitoring address storage unit 30. The monitoring bits may be selected in a tail-bits region, that is, a region including tail bits, of a pause refresh characteristic diagram shown in FIG. 6. Referring briefly to FIG. 6, the x axis represents a pause time and the y axis represents the normalized number of accumulated error bits. The tail-bits region denoted as a dotted line portion at reference area "a" is defined as a region where an error occurs earlier than a predicted pause time. That is, in the bits of the tail-bits region, a leakage current easily occurs according to a change in process, voltage, and temperature (PVT), as compared with the bits outside of the tail-bits region "a". Therefore, the characteristics of all of the data bits can be judged by monitoring only the bits of the tail-bits region.

Multiple monitoring bits can be selected in the tail-bits region such that the self refresh cycle tREF can be adjusted if a first monitoring bit has an error and a second monitoring bit does not have an error. Unlike the present embodiment of the invention, when monitoring is not performed separately in the tail-bits region, since the bits of the tail-bits region are more likely to have an error, the self refresh cycle tREF needs to be set sufficiently large such that none of the bits of the tail-bits region have an error. In contrast, the present embodiment of the invention corrects a predetermined number of data bits using the ECC bit with low power consumption and thus, the self refresh cycle tREF can be increased. In particular, a most leaky bit (bit(0)) and a least leaky bit (bit(n)) in the tail-bits region can be included. For example, the self refresh cycle tREF can be adjusted such that the most leaky bit (bit(0)) has an error and the least leaky bit (bit(n)) does not have an error.

Monitoring address storage unit 30 stores the addresses MA of the monitoring bits. Monitoring address storage unit 30 may be of a nonvolatile type, for example, the addresses may be stored using a fuse. Refresh cycle determining circuit 40 adjusts the self refresh cycle tREF depending on whether or not an error occurs in the monitoring bits detected by ECC engine 20. In operation, refresh cycle determining circuit 40 can be enabled in response to a refresh instruction signal PRFH from a refresh mode entry detecting circuit 50 which detects entry into the self refresh mode and generates refresh instruction signal PRFH. Refresh mode entry detecting circuit 50 detects the need to enter the self refresh mode in response to an instruction defined by a combination of multiple control signals /CS, /CAS, /RAS, /WE, CKE, and CLK and supplies the high-level refresh instruction signal PRFH to refresh cycle determining circuit 40. Specifically, if chip selection signal /CS, column address strobe signal /CAS, row address strobe signal /RAS, and clock enable signal CKE is low and a write enable signal /WE is high, refresh instruction signal PRFH goes high. If clock enable signal CKE is high, the refresh instruction signal PRFH becomes low which represents the end of the self refresh operation.

Refresh cycle determining circuit 40 sets an initial self refresh cycle tREF and supplies a refresh cycle determination signal CRFH to internal address generator 60. The internal address generator 60 generates a pulse for each operation cycle during the self refresh operation and generates counting addresses which sequentially increase in response to the operation cycle pulses. With a combination of the counting addresses, assigned row addresses RA1 to RAn are sequentially switched. Here, the operation cycle can be changed to correspond to the refresh cycle determination signal CRFH. Refresh cycle determining circuit 40 also supplies a timing signal TS to monitoring address storage unit 30 whenever a predetermined time Δt passes. The monitoring address storage unit 30 supplies the monitoring addresses MA to row decoder 12 and column decoder 16 in response to timing signal TS. Sense amplifier and write driver 14 supplies the monitoring bits corresponding to the monitoring addresses MA to ECC engine 20 which detects whether or not an error occurs in the monitoring bits. In this case, the refresh cycle determining circuit 40 supplies the refresh cycle determination signal CRFH adjusted according to the detection result of ECC engine 20 to internal address generator 60 so as to adjust the self refresh cycle tREF. Since the timing signal TS is supplied to monitoring address storage unit 30 whenever the predetermined time Δt passes, the self refresh cycle tREF is adjusted whenever the predetermined time Δt passes.

Figure 2:
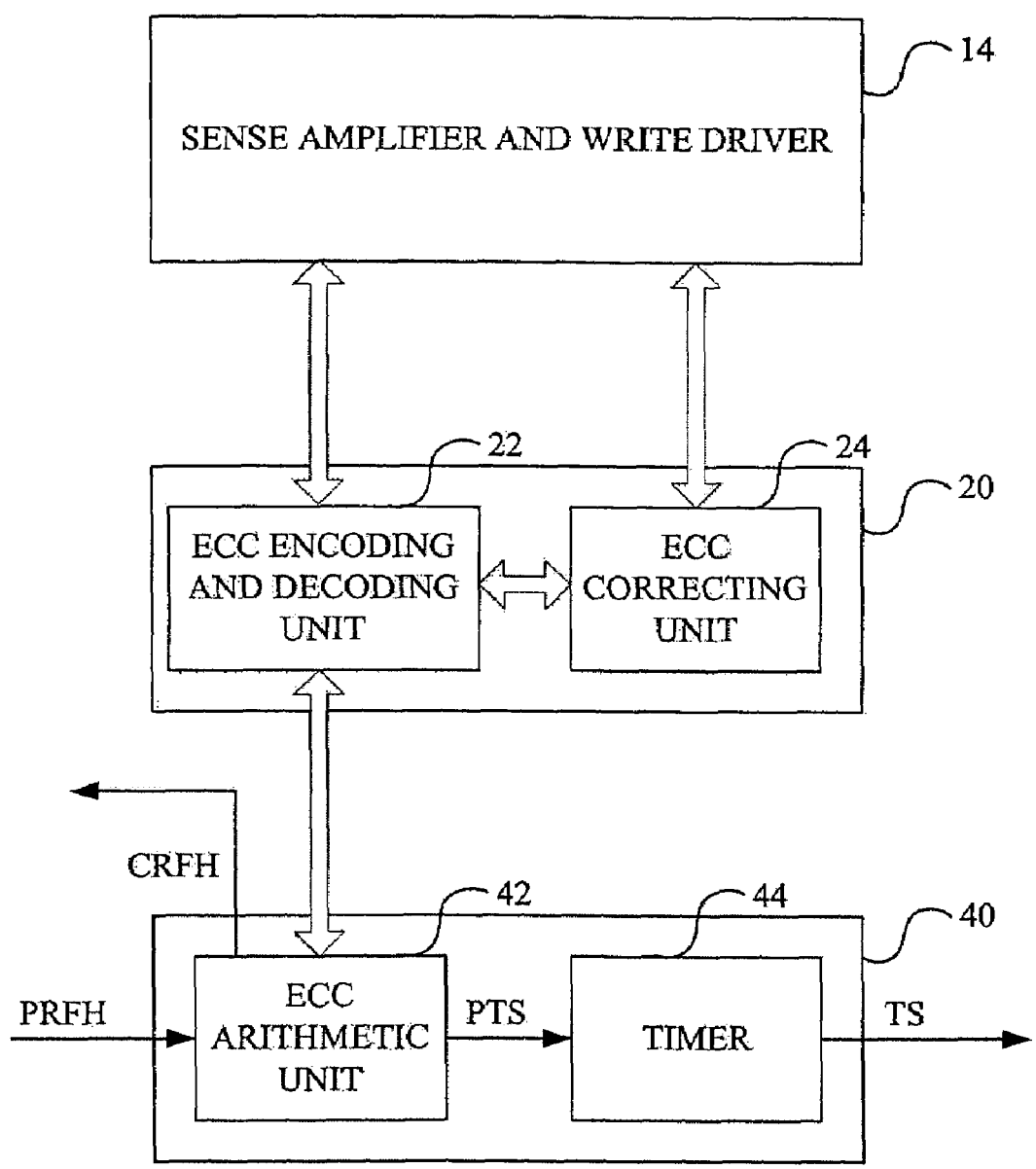
FIG. 2 is a block diagram illustrating a refresh cycle determining circuit and an ECC engine shown in FIG. 1.

Referring to FIG. 2, refresh cycle determining circuit 40 includes an ECC arithmetic unit 42 and a timer 44. ECC engine 20 includes an ECC encoding and decoding unit 22 and an ECC correcting unit 24. The ECC arithmetic unit 42 receives the refresh instruction signal PRFH and causes ECC encoding and decoding unit 22 to generate an ECC bit corresponding to the data bits using the data bits in memory array 10. The sense amplifier and write driver 14 writes the generated ECC bit into memory array 10. The ECC arithmetic unit 42 sets the initial self refresh cycle tREF and supplies refresh cycle determination signal CRFH corresponding to the initial self refresh cycle tREF to internal address generator 60. ECC arithmetic unit 42 then supplies a previous timing signal PTS to timer 44 which supplies the timing signal TS to the monitoring address storage unit 30 in response to the previous timing signal PTS whenever the predetermined time Δt passes. In this case, the predetermined time Δt is not a constant value, but may vary according to temperature or the application of memory. Therefore, the monitoring bits in the memory array 10 are read through the sense amplifier and write driver 14 whenever the predetermined time Δt passes. The ECC encoding and decoding unit 22 detects whether or not an error occurs in the read monitoring bits. The ECC arithmetic unit 42 analyzes the detection result of the ECC encoding and decoding unit 22 and supplies the refresh cycle determination signal CRFH for adjusting the self refresh cycle tREF to the internal address generator 60 again.

When the ECC arithmetic unit 42 determines that the self refresh mode is exited, the ECC arithmetic unit 42 causes ECC engine 20 to correct the error in the memory array 10. ECC encoding and decoding unit 22 reads the data bits and the ECC bit in memory array 10 so as to detect whether or not an error occurs. The ECC correcting unit 24 corrects the data bits using the ECC bit and the sense amplifier and write driver 14 rewrites the corrected data bits.

Figure 3:
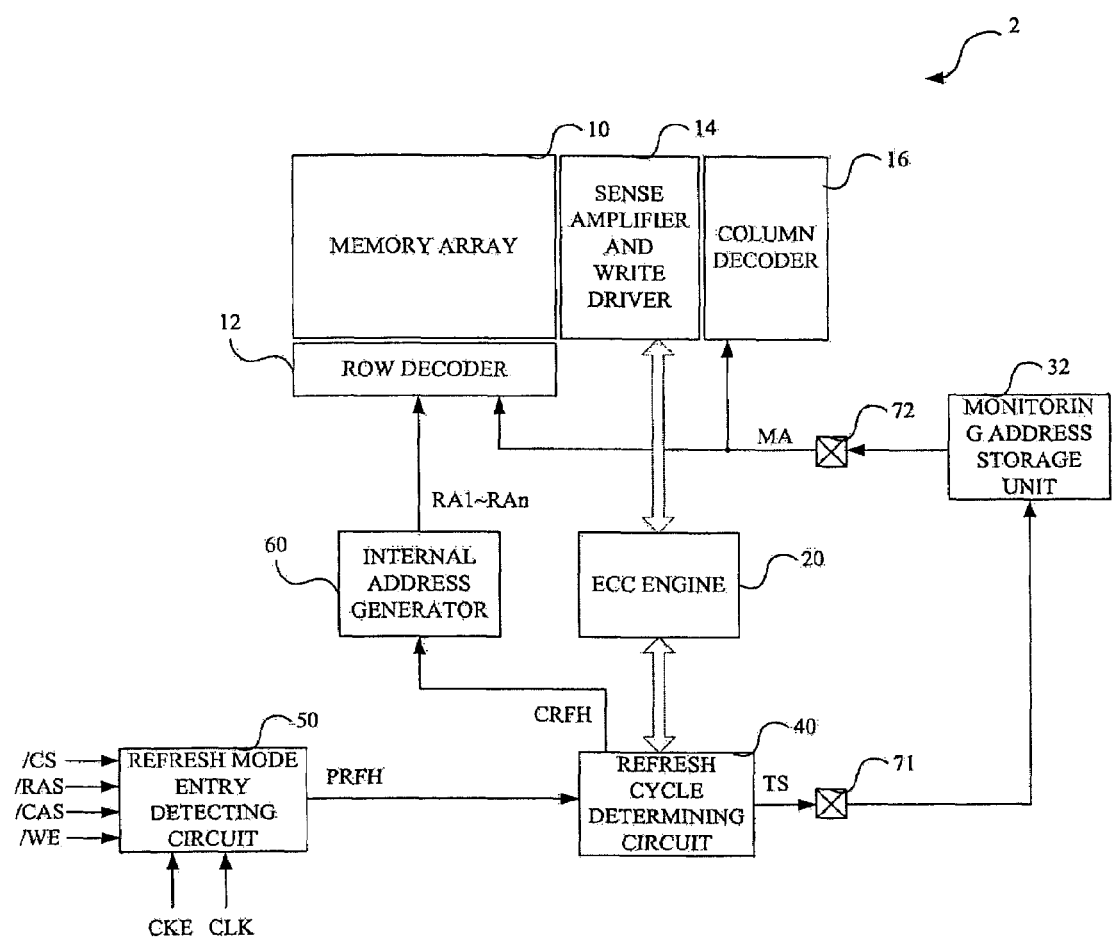
FIG. 3 is a circuit diagram illustrating a dynamic random access memory device according to another embodiment of the present invention.

Referring to FIG. 3, a dynamic random access memory device 2 utilizes a Read Only Memory (ROM) as monitoring address storage unit 32. Refresh cycle determining circuit 40 supplies the timing signal TS to monitoring address storage unit 32 through a predetermined control pin 71 and the monitoring address storage unit 32 supplies the monitoring addresses MA to row decoder 12 and column decoder 16 through predetermined address pin 72.

Figure 4:
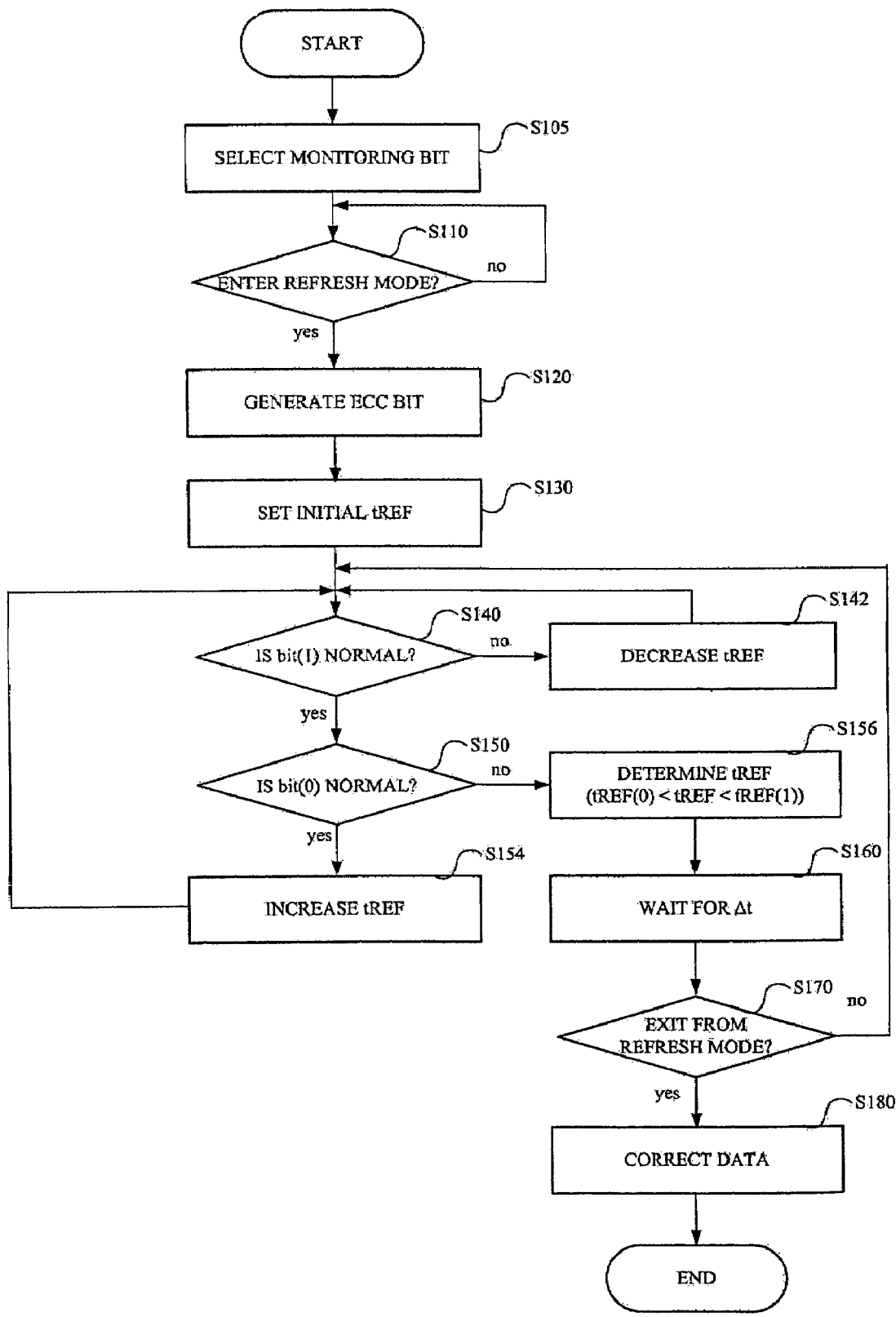
FIG. 4 is a flow chart illustrating a method of determining a refresh cycle of a dynamic random access memory device according to an embodiment of the present invention.

FIG. 4 is a flow chart illustrating a method of determining a refresh cycle of a dynamic random access memory device where two bits are the selected monitoring bits. Reference is also made to FIG. 1 as needed. Monitoring bits are selected and the monitoring addresses MA are stored in monitoring address storage unit 30 at step S105. These monitoring bits can be selected in the tail-bits region of the pause refresh characteristic diagram and may be, for example, the most leaky bit (bit(0)) and the least leaky bit (bit(1)) in the tail-bits region, but are not limited thereto. A determination is made at step S110 whether or not to enter the self refresh mode. Specifically, the refresh mode entry detecting circuit 50 detects entry to the self refresh mode in response to an instruction defined by the combination of the multiple control signals /CS, /CAS, /RAS, /WE, CKE, and CLK and supplies the refresh instruction signal PRFH to refresh cycle determining circuit 40. The ECC (Error correction code) bit is generated at step S120 where refresh cycle determining circuit 40 causes ECC engine 20 to generate an ECC bit corresponding to the data bits from memory array 10.

At step S130, refresh cycle determining circuit 40 sets the initial self refresh cycle tREF and supplies the refresh cycle determination signal CRFH corresponding to the initial self refresh cycle tREF to internal address generator 60. The internal address generator 60 sequentially changes the row addresses RA1 to RAn for each operation cycle, such that the self refresh operation is performed. A determination is made at step S140 whether or not the monitoring bit (bit(1)) is normal. Specifically, if an error occurs in bit (bit(1)), the self refresh cycle tREF is decreased at step S142. Even though bit(1) is less leaky as compared with bit(0), since an error occurs the occurrence of the error is reduced by decreasing the self refresh cycle tREF. After the self refresh cycle tREF decreases, a determination is made again whether or not the monitoring bit (bit(1)) is normal. If the monitoring bit (bit(1)) is normal, step S150 determines if monitoring bit (bit(0)) is normal. Specifically, if bit(0) is normal, the self refresh cycle tREF increases at step S154. Even though bit bit(0) is more leaky as compared with bit(1), since it is normal (that is, both of bit(0) and bit(1) are normal), it is determined that the self refresh cycle tREF is too short, and thus the self refresh cycle tREF increases.

If an error occurs in the monitoring bit bit(0), the self refresh cycle tREF is fixed at step S156. That is, the self refresh cycle tREF is set to satisfy the condition tREF(0) <tREF<tREF(1). Here, tREF(1) and tREF(0) means self refresh cycles that cause errors to occur in bit(1) and bit(0), respectively. When the self refresh cycle tREF is determined, the refresh cycle determining circuit 40 supplies the refresh cycle determination signal CRFH to internal address generator 60 such that self refresh operation is performed based on the determined self refresh cycle tREF. At step S160, the process waits for the predetermined time Δt. Here, the predetermined time Δt is not a constant value, but can vary according to temperature or the application of memory. Next, a determination is made at step S170 whether or not the self refresh mode is to be exited. Specifically, for example, if clock enable signal CKE becomes high, the refresh instruction signal PRFH becomes low which represents the end of the self refresh operation. At step S180, data is corrected before the self refresh mode is exited. ECC engine 20 corrects the data bits using the ECC bit in memory array 10. In this manner, the self refresh cycle tREF can be actively changed with respect to changes in PVT since a determination is made whether or not the error occurs in the prescribed multiple monitoring bits whenever the predetermined time Δt passes and the self refresh cycle tREF is adjusted. Further, since the self refresh cycle tREF is extended to the maximum refresh cycle, standby power consumption of the dynamic random access memory device is minimized.

Figure 5:
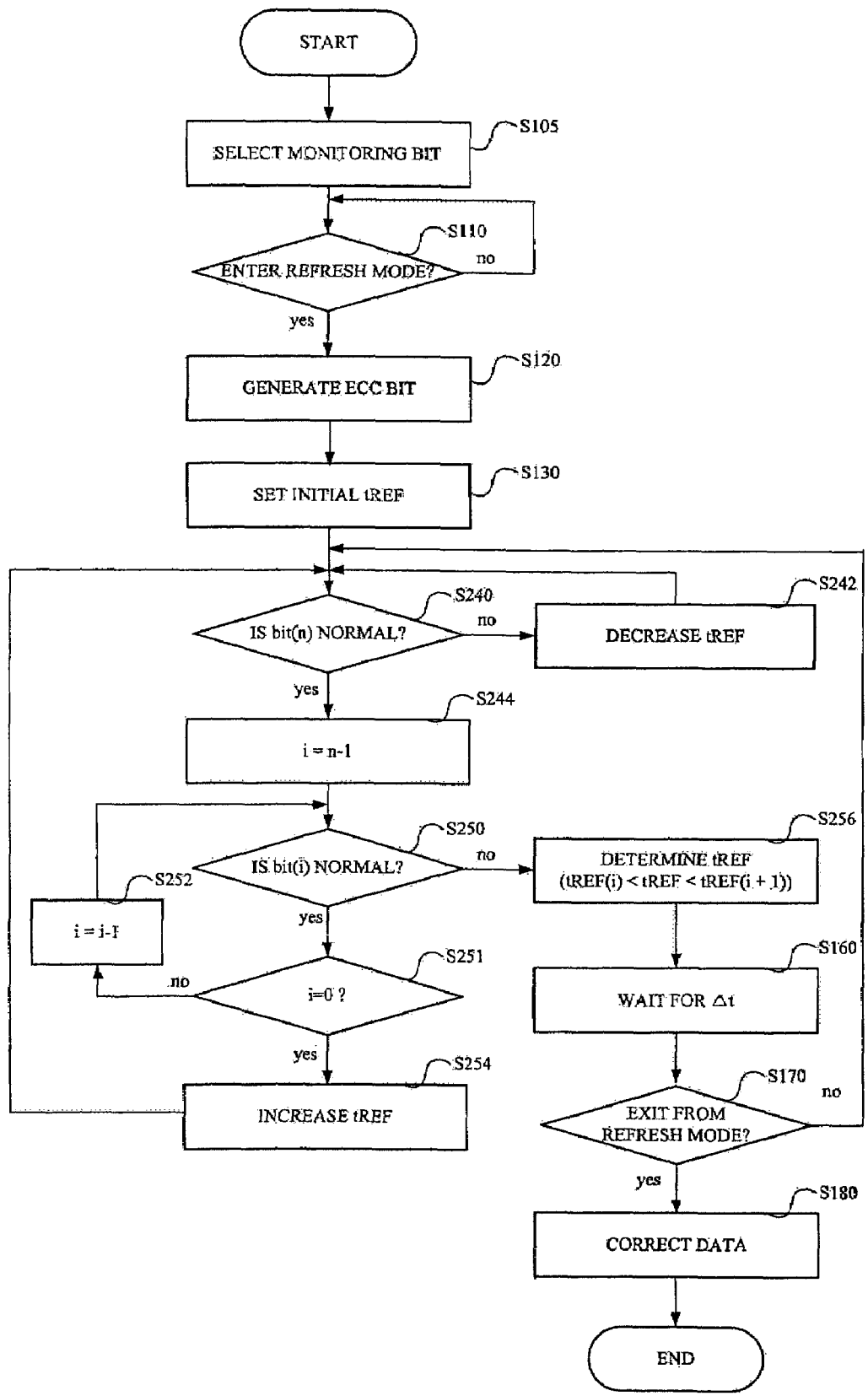
FIG. 5 is a flow chart illustrating a method of determining a refresh cycle of a dynamic random access memory device according to another embodiment of the present invention.

FIG. 5 is a flow chart illustrating a method of determining a refresh cycle of a dynamic random access memory device. Monitoring bits are selected and the monitoring addresses MA are stored in monitoring address storage unit 30 at step S105. The multiple monitoring bits are selected from the tail-bits region of the pause refresh characteristic diagram and multiple monitoring bits are represented as bit(0), bit(1), ..., and bit(n) in a more leaky order. At step S110, it is detected whether or not the self refresh mode is to be entered, and an ECC bit is generated at step S120. Subsequently, the initial self refresh cycle tREF is set at step S130. A determination is made at step S240 to determine whether or not the monitoring bit (bit(n)) is normal. When the error occurs in bit(n), the self refresh cycle tREF decreases at step S242. When bit(n) is normal, i=n−1 is substituted with n at step S244.

At step S250, a determination is made whether or not bit(i) is normal (that is, whether or not bit(n−1) is normal). If bit(n−1) is normal, a check is performed to determine if i=0 at step S251, or in other words, whether or not there are remaining bits to be monitored. When there are remaining bits to be monitored, the equation i=i−1 is performed at step S252, and it is concluded whether or not bit(i) is normal (that is, whether or not bit(n−2) is normal) at step S250. When all of the monitoring bits bit(0), bit(1), ..., and bit(n) are normal, the self refresh cycle tREF increases at step S254. If an error occurs in bit(i), the self refresh cycle tREF is corrected at step S256. That is, the self refresh cycle tREF is determined to satisfy the condition tREF(i)<tREF<tREF(i+1) where tREF (i+1) and tREF(i) means self refresh cycles that cause errors to occur in bit(i+1) and bit(i), respectively. Next, the process waits for the predetermined time Δt step S160 and it is determined, at step S170, whether or not the self refresh mode is to be exited. Subsequently, data is corrected before the self refresh mode is exited at step S180.

Alternatively, the process may also be configured to determine whether or not an error occurs in the multiple monitoring bits selected in the tail-bits region in a non-leaky sequence; a leaky sequence or in randomly selected monitoring bits. This determination may also be performed using a combination of the non-leaky and leaky sequences.

In this manner, since the self refresh cycle of the memory device is adjusted by detecting for each predetermined time, whether or not an error of the prescribed multiple monitoring bits occurs, the self refresh cycle can be actively changed according to the change in PVT. In addition, since the self refresh cycle extends to the maximum prescribed time period, power consumption for the device is minimized.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A dynamic random access memory device comprising:
   a memory array having a plurality of memory cells for storing data;
   a monitoring address storage unit storing a plurality of monitoring addresses corresponding to monitoring bits stored in said memory array, said monitoring bits being selected in a tail bits region associated with a pause refresh characteristic of said memory array;
   an error correction code (ECC) engine detecting whether or not an error occurs in said monitoring bits; and
   a refresh cycle determining circuit communicating with said monitoring address storage unit and adjusting a self refresh cycle of said memory device depending on whether or not an error is detected in said monitoring bits.

2. The dynamic random access memory device of claim 1, wherein said monitoring bits comprise selected data bits from said stored data, and an ECC bit providing error information associated with said selected data bits.

3. The dynamic random access memory device of claim 1, wherein said monitoring bits include a most leaky bit and a least leaky bit.

4. The dynamic random access memory device of claim 1, wherein the monitoring address storage unit is a nonvolatile type memory.

5. The dynamic random access memory device of claim 4, wherein said monitoring address storage unit includes a fuse.

6. The dynamic random access memory device of claim 4, wherein said monitoring address storage unit includes a read only memory (ROM).

7. The dynamic random access memory device of claim 1, wherein said monitoring bits include a first and second monitoring bit, said refresh cycle determining circuit adjusts the self refresh cycle of said memory array such that said first monitoring bit has an error and said second monitoring bit is normal.

8. The dynamic random access memory device of claim 1, wherein said monitoring bits include a most leaky monitoring bit, said refresh cycle determining circuit increases the self refresh cycle of said memory array when said most leaky monitoring bit is normal.

9. The dynamic random access memory device of claim 1, wherein said monitoring bits include a least leaky monitoring bit, said refresh cycle determining circuit decreases the self refresh cycle of said memory array when said least leaky monitoring bit has an error.

10. The dynamic random access memory device of claim 1, wherein said refresh cycle determining circuit adjusts the self refresh cycle of said memory array depending on whether or not an error occurs in said monitoring bits a predetermined time after the adjustment of the self refresh cycle.

11. A method of determining a refresh cycle of a dynamic random access memory device comprising;
    selecting multiple monitoring bits stored in a memory array, said multiple monitoring bits being selected in a tail-bits region associated with a pause refresh characteristic of said memory array;
    detecting whether or not an error occurs in said selected monitoring bits; and thereafter,
    adjusting a self refresh cycle of said memory array depending on whether or not an error is detected in said monitoring bits.

12. The method of claim 11, wherein the monitoring bits comprise:
    data bits corresponding to selected data stored in said memory array; and
    an ECC bit generated by an ECC engine circuit based on said selected data and representing whether or not an error occurs in said selected data bits.

13. The method of claim 11, wherein said selected monitoring bits include a most leaky bit and a least leaky bit.

14. The method of claim 11, wherein said selected monitoring bits include a first and second monitoring bit, said adjusting of the refresh cycle is performed such that said first monitoring bit has an error and said second monitoring bit is normal.

15. The method of claim 11, wherein said selected monitoring bits include a most leaky monitoring bit, said adjusting of the refresh cycle further comprising increasing the self refresh cycle when said most leaky monitoring bit is normal.

16. The method of claim 11, wherein said selected monitoring bits include a least leaky monitoring bit, said adjusting of the refresh cycle further comprising decreasing the self refresh cycle when the least leaky monitoring bit among the selected monitoring bits has an error.

17. The method of claims 11, wherein said self refresh cycle is repeatedly adjusted depending on whether or not an error occurs in said monitoring bits a predetermined time after adjusting said self refresh cycle.

18. A method of determining a refresh cycle of a dynamic random access memory device, the method comprising:
    selecting multiple monitoring bits in a tail-bits region of stored data;
    detecting whether or not an error occurs in said selected monitoring bits; and thereafter,
    adjusting a self refresh cycle such that a first monitoring bit from said selected bits has an error and a second monitoring bit from said selected bits becomes normal.

19. The method of claim 18, wherein said selected monitoring bits include a most leaky monitoring bit, said adjusting of the refresh cycle further comprising increasing the self refresh cycle when said most leaky monitoring bit is normal.

20. The method of claim 18, wherein said selected monitoring bits include a least leaky monitoring bit, said adjusting of the refresh cycle further comprising decreasing the self refresh cycle when said least leaky monitoring bit has an error.

* * * * *